United States Patent [19]

Nishio

[11] Patent Number: 5,136,663

[45] Date of Patent: Aug. 4, 1992

[54] VECTOR QUANTIZATION IMAGE PROCESSING APPARATUS

[75] Inventor: Takatoshi Nishio, Toyonaka, Japan

[73] Assignee: Matsushita Electric Industrial Co., Ltd., Osaka, Japan

[21] Appl. No.: 454,951

[22] Filed: Dec. 22, 1989

[30] Foreign Application Priority Data

Dec. 23, 1988 [JP] Japan .................................. 63-326595

[51] Int. Cl.$^5$ .............................................. G06K 9/00
[52] U.S. Cl. ....................................... 382/56; 358/133; 358/135; 381/36
[58] Field of Search ................... 382/56; 358/133, 135; 381/36

[56] References Cited

U.S. PATENT DOCUMENTS

| 4,560,977 | 12/1985 | Murakami et al. | 340/347 |
| 4,670,851 | 6/1987 | Morakami et al. | 364/518 |
| 4,710,812 | 12/1987 | Murakami et al. | 358/136 |
| 4,797,945 | 1/1989 | Suzuki et al. | 382/56 |

OTHER PUBLICATIONS

"Vector Quantiser of Video Signals"; Electronics Letters, Nov. 11, 1982, vol. 18 No. 23, pp. 1005-1006.

Primary Examiner—David K. Moore
Assistant Examiner—Daniel Santos
Attorney, Agent, or Firm—Wenderoth, Lind & Ponack

[57] ABSTRACT

A vector quantization image processing apparatus includes a minimum value separation circuit, a normalization circuit, and a first codebook. By separating the minimum value of the inputted vector and normalizing at the maximum value, it is possible to reduce drastically the number of output vectors. Using the position information of the inputted vector, the output vectors in the first codebook are classified to make it possible to search for the optimum output vector at a high speed.

14 Claims, 1 Drawing Sheet

VECTOR QUANTIZATION IMAGE PROCESSING APPARATUS

BACKGROUND OF THE INVENTION

1. Field of the Invention

The present invention relates to a vector quantization image processing apparatus for coding video signals with a high efficiency.

2. Description of the Prior Art

In supporting the present society, there has been enhanced importance held by information. To cope with this trend, the needs for the electronic communication services have been elevated and diversified. As one of these diversified services, there is a scheme to incorporate image services in addition to the existing music and sound services.

However, in general, image information involves a large amount of information to be generated and a large surplus degree. For this reason, it is necessary for the amount of information to be curtailed by high efficiency encoding. In realizing this high efficiency encoding, vector quantization is being studied.

Conventional vector quantization image processing apparatuses include a mean value separation circuit, an amplitude normalization circuit, a distortion operation circuit, a codebook ROM, and a distortion detection circuit. The mean value separation circuit takes in an input vector which is constituted by converting image data into a block form, and it calculates the mean value of the amplitudes of all elements of the inputted vectors to output the obtained mean value, and also outputs the vector with a zero mean after subtraction of the mean value from the amplitude of each element of the inputted vector. The amplitude normalization circuit calculates a standard deviation from the vector with a zero mean from the zero mean circuit as an amplitude coefficient to output the obtained amplitude coefficient, and also outputs the vector with a zero mean and unit standard deviation obtained by subtracting the amplitude coefficient from each element of the inputted vector. The distortion operation circuit is so operated that, when a vector with a zero mean and unit standard deviation is sent, it reads out the output vectors sequentially from the codebook ROM (Read Only Memory), and calculates the total of the absolute values of the differences of each element between the vector with a zero means and unit standard deviation and the output vector as a distortion, and it outputs, of the output vectors stored in the codebook ROM, an index value corresponding to the output vector whose distortion with the vector with a zero mean and unit standard deviation was the smallest. (Ref.: "Vector quantizer of video signals "Electron, Lett., Vol. 7, pp 1005-1006 November 1982).

Such a conventional vector quantization image processing apparatus shows an effect of eliminating the statistical property of the image by separating a zero mean from the input vector and dividing it by the unit standard deviation, but has a defect in that it requires a long operation processing time period.

SUMMARY OF THE INVENTION

An object of the present invention is to effect a preprocessing for elimination of the statistical property of an image before vector quantization and to shorten the operation processing time for performing vector quantization.

In order to attain the above object, the present invention separates a minimum value from input vectors in which an input image signal is divided into blocks so as to eliminate the direct current component of the image signal and simultaneously limits an area in an ROM in which a plurality of predetermined output vectors are stored by utilizing the fact that an amplitude corresponding to an element corresponding to the minimum value is zero, so as to shorten the operation processing time.

Furthermore, in order to normalize the video signal, the maximum value may be extracted from the vector obtained by subtracting the minimum value from the input vector. Alternatively, by utilizing the fact that the amplitude value corresponding to the element corresponding to the maximum value is 1, a further shortening of the operation processing time may be effected. Furthermore, vector quantization may be applied to both the minimum value and the maximum value separated from the input vector to improve the coding efficiency.

A vector quantization image processing apparatus as a preferred embodiment of the present invention for processing a block of k samples of an input image signal, where k is an integer, regarding the block of k samples as an input vector composed k elements, comprises: a minimum value separation circuit for detecting an element having a minimum value among the k elements of the input vector, and for subtracting the minimum value from a value of each of the k elements of the input vector to obtain a minimum value separation vector, and for producing a first group number determined by a position of the element having the minimum value; a first codebook ROM having stored therein a plurality of groups of first output vectors based on a statistical property of the minimum value separation vector and first index values corresponding respectively to the first output vectors, and for selecting one of the plurality of groups which is determined by the first group number produced by the minimum value separation circuit, and for reading out first output vectors of the selected group and first index values corresponding thereto, the number of the read out first output vectors being a specific number determined by the first group number, and for thereafter outputting a reset signal; and a first distortion operation circuit for calculating distortions from the minimum value separation vector produced by the minimum value separation circuit and the first output vectors read out from the first codebook ROM, and being responsive to the reset signal for outputting a first index value corresponding to a first output vector which provides by the distortion calculation a minimum distortion from among the calculated distortions.

By the above construction, it is possible to carry out the elimination of the direct current component of the image by separating the minimum value from the input vector and to shorten the operation processing time by high speed search of the optimum output vector using the position information of the input vector to which the minimum value is given.

DESCRIPTION OF THE PREFERRED EMBODIMENTS

Figure 1:
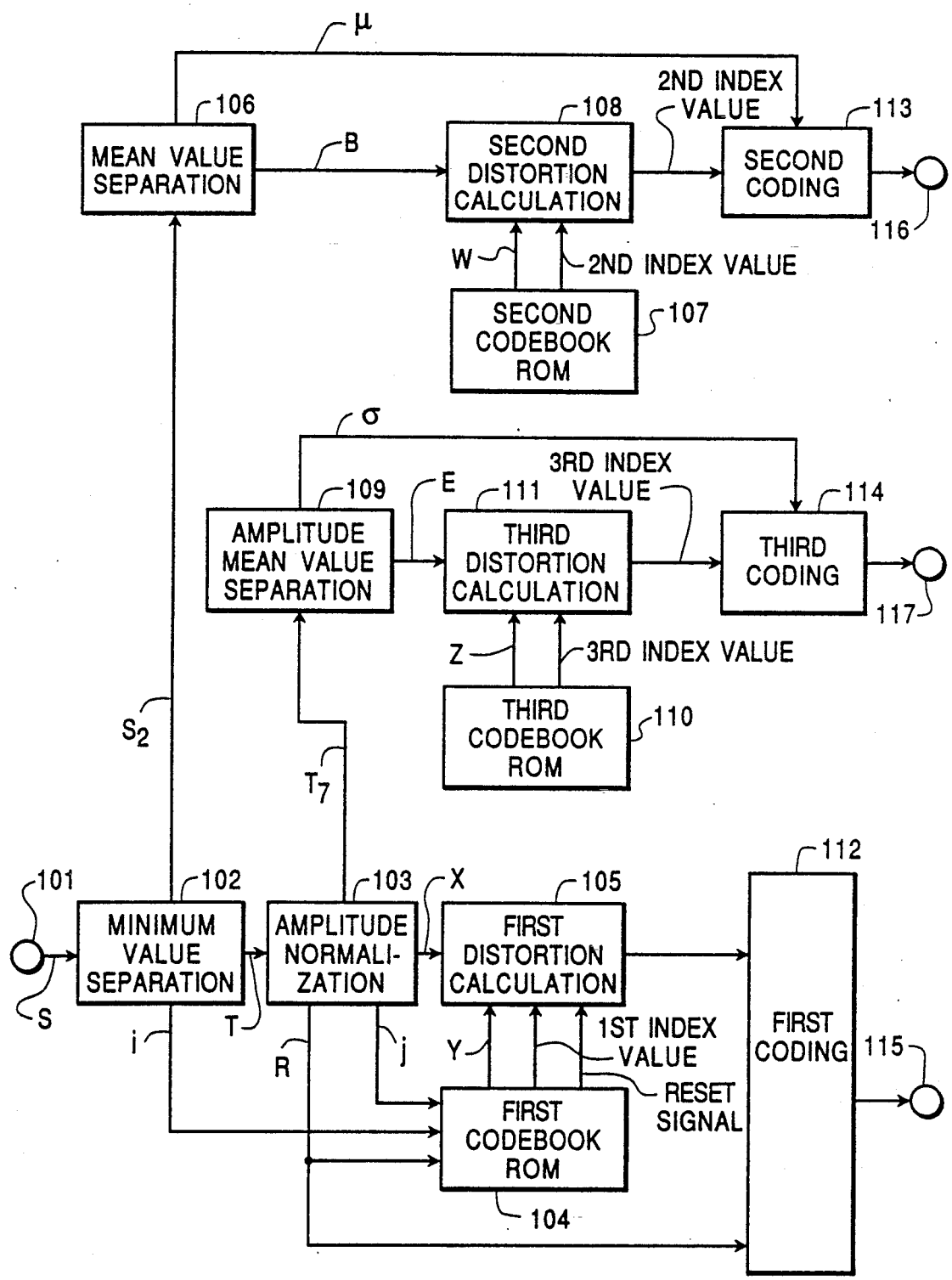
FIG. 1 is a block diagram showing a construction of the vector quantization coding apparatus according to one embodiment of the present invention.

Hereinafter, the vector quantization image processing apparatus according to one embodiment of the present invention is explained with reference to the drawing.

In FIG. 1, element 101 is a signal input terminal element, 102 is a minimum value separation circuit element, 103 is an amplitude normalization circuit element, 104 is a first codebook ROM element, 105 is a first distortion operation circuit element, 106 is a mean value separation circuit element, 107 is a second codebook ROM element, 208 is a second distortion operation circuit element, 109 is an amplitude mean value separation circuit element, 110 is a third codebook ROM element, 111 is a third distortion operation circuit element, 112 is a first coding circuit element, 113 is a second coding circuit element, 114 is a third coding circuit element, 115 is a first signal output terminal element, 116 is a second signal output terminal, and element 117 is a third signal output terminal.

Signals blocked in the unit of 12 samples: $S=(S_1, S_2, \ldots S_{13})$ are inputted as input vectors from the signal input terminal 101.

Table 1 is a table relating to the first group numbers which can be judged from the position of the input vector element to which the minimum value separation circuit 102 has given the minimum value.

TABLE 1

| Assuming the input vector S to be $(S_1, S_2, \ldots, S_{12})$, and the first group number to be i, | |
|---|---|
| In case of $S_1, S_2, S_3$: | i = 1 |
| In case of $S_4, S_5, S_6$: | i = 2 |
| In case of $S_7, S_8, S_9$: | i = 3 |
| In case of $S_{10}, S_{11}, S_{12}$: | i = 4 |

Assuming, for example, that the element $S_2$ of the input vector S is the minimum value, then the minimum value separation circuit 102 obtains the minimum value $S_2$ and determines the first group number to be 1 from Table 1, and subtracts the minimum value $S_2$ from each element of the input vector to determine the minimum value separation vector T, as follows:

$$T_L = S_L - S_2 (L=1, 2, \ldots, 12)$$

$$T = (T_1, T_2, \ldots, T_{12})$$

The obtained minimum value $S_2$ is sent to the mean value separation circuit 106, the first group number 1 is sent to the first codebook 104, and the minimum value separation vector T is sent to the amplitude normalization circuit 103.

Table 2 is a table relating to the second group number which can be judged from the position of the factor of the minimum value separation vector to which the amplitude normalization circuit 103 has given the maximum value.

TABLE 2

| Assuming the minimum value separation vector T to be $(T_1, T_2, \ldots, T_{12})$, and the second group number to be j, | |
|---|---|
| In case of $T_1, T_2, T_3$: | j = 1 |
| In case of $T_4, T_5, T_6$: | j = 2 |
| In case of $T_7, T_8, T_9$: | j = 3 |
| In case of $T_{10}, T_{11}, T_{12}$: | i = 4 |

Table 3 is a table relating to the reset signal control value to be judged by the maximum value obtained by the amplitude normalization circuit 103.

TABLE 3

| Assuming the maximum value to be MAX, and the reset signal control value to be R. | | |
|---|---|---|
| (A) In case of | $0 \leq MAX \leq 10$: | R = 1 |
| (B) In case of | $10 \leq MAX \leq 50$: | R = 2 |
| (C) In case of | $50 \leq MAX \leq 100$: | R = 3 |
| (D) In case of | $100 \leq MAX$: | R = 4 |

Now, assuming that $T_7$ of the element of the minimum value separation vector T has a maximum value of 41, the amplitude normalization circuit 103 obtains the maximum value $T_7$, determines the second group number as 3 from Table 2, and determines the reset signal control value as 2 from Table 3. The circuit 103 divides each element TL of the minimum value separation vector T by the maximum value $T_7$ to determine the minimum value sepration normalization spectrum X, as follows:

$$X_L = T_L/T_7 (L=1, 2, \ldots, 12)$$

$$X = (X_1, X_2, \ldots, X_{12})$$

The obtained maximum value $T_7$ is sent to the amplitude mean value separation circuit 109; the minimum value separation normalization vector X is sent to the first distortion operation circuit 105; the second group number 3 is sent to the first codebook 104, and the reset signal control value 2 is sent to the first codebook ROM 104 and the first encoding circuit 112.

The mean value separation circuit 106 converts the minimum value sent from the minimum value separation circuit 102 as an input signal into the blocked vectors $A = (A_1, A_2, \ldots, A_n)$ in units of 8 samples. The means value $\mu$ is obtained according to the following equations, and the mean value $\mu$ is subtracted from each element to determine the mean value separation vector B, as follows:

$$\mu' = \sum_{i=1}^{8} A_i$$

$$\mu = (\tfrac{1}{8}) \times \mu'$$
$$B_L = A_L - \mu \ (L=1, 2, \ldots, 8)$$
$$B = (B_1, B_2, \ldots, B_8)$$

The obtained mean value $\mu$ is sent to the second encoding circuit 113, and the mean value separation vector B is sent to the second distortion operation circuit 108. When the vector B is sent to the second distortion operation circuit 108, assuming the number of the second output vectors stored in the second codebook ROM 107 to be 512, the second codebook ROM 107 outputs the second output vector and the second index value corresponding to the second output vector for 512 times. The second distortion operation circuit 108 obtains the distortion d2 by the following equation using the mean value separation vector B and the second output vector $W = (W1, W2, \ldots, W8)$ from the second codebook ROM 107.

$$d2 = \sum_{i=1}^{8} |Wi - Bi|$$

In case the distortion d2 is a distortion d2 which is smaller than that before, the newly obtained distortion d2 and the second index value are read in. After the second output vectors are taken in 512 times, the read in second index value is sent to the second encoding circuit 113. The second encoding circuit 113 performs variable length encoding on the mean value from the mean value separation circuit 106 and the second index value from the second distortion operation circuit 103, respectively, using Huffman coding, and outputs the results to the second signal output terminal 116.

The amplitude mean value separation circuit 109 converts the maximum value sent from the amplitude normalization circuit 103 as an input signal into the blocked vectors $C = (C_1, C_2, \ldots, C_6)$ in unit of 6 samples. And, according to the following equations the amplitude mean value $\sigma$ is obtained, and the amplitude mean value $\sigma$ is subtracted from each element to determine the amplitude mean value separation vector E, as follows:

$$\sigma' = \sum_{i=1}^{6} C_i$$

$\sigma = (1/6) \times \sigma'$
$E_L = C_L - \sigma$ (L = 1, 2, ..., 6)
$E = (E_1, E_2, \ldots, E_6)$ The obtained amplitude mean value $\sigma$ is sent to the third encoding circuit 114, and the amplitude mean value separation vector E is sent to the third distortion operation circuit 111. When the amplitude mean value separation vector E is sent to the third distortion operation circuit 111, assuming the number of the third output vectors stored in the third codebook ROM 110 to be 512, the third codebook ROM 110 outputs the third output vector and the third index value corresponding to the third output vector for 512 times. The third distortion operation circuit 111 obtains the distortion $d_3$ by the following equation using the amplitude mean value separation vector E and the third output vector $Z = (Z_1, Z_2, \ldots, Z_6)$ from the third codebook ROM 107.

$$d_3 = \sum_{i=1}^{6} |Z_i - E_i|$$

In case the distortion $d_3$ is a distortion $d_3$ which is smaller than that before, the newly obtained distortion $d_3$ and the third index value are read in. After the third output vectors are taken in 512 times, the read in third index value is sent to the third encoding circuit 114. The third encoding circuit 114 performs variable length encoding on the amplitude mean value from the amplitude mean value separation circuit 109 and the third index value from the third distortion operation circuit 111; respectively, using Huffman coding, and outputs the results to the third signal output terminal 117.

Table 4 is a table relating to the grouping of the first output vectors outputted by the first codebook and the output times of the first output vector corresponding to the grouping.

TABLE 4

Assuming the first group number to be i, the second group number to be j, the number of output times of the first output vector to be m, and the grouping to be n, in the case of $1 \leq i \leq 2$:

TABLE 4-continued

Assuming the first group number to be i, the second group number to be j, the number of output times of the first output vector to be m, and the grouping to be n,

| | | |
|---|---|---|
| (A) when $1 \leq j \leq 2$, | m = 32 | n = 1 |
| (B) when $3 \leq j \leq 4$, | m = 256 | n = 2 |
| in the case of $3 \leq i \leq 4$: | | |
| (C) when $1 \leq j \leq 2$, | m = 256 | n = 3 |
| (D) when $3 \leq j \leq 4$, | m = 64 | n = 4 |

Table 5 is a table relating to the control of the reset signal which the first codebook 104 can judge from the reset signal control value outputted by the amplitude normalization circuit 103.

TABLE 5

Assuming the reset signal control value to be R, the number of output times of the first output vector obtained from Table 4 to be m, and the number of output times of the first output vector newly set to be M,

| | |
|---|---|
| (A) in case of R = 1, | M = m/4 |
| (B) in case of R = 2, | M = m/3 |
| (C) in case of R = 3, | M = m/2 |
| (D) in case of R = 4, | M = m |
| | (Fractions below decimal omitted) |

When the vector X with a minimum value normalization and unit standard deviation is sent to the first distortion operation circuit 105, in the first codebook 104, because of the fact that the first group number from the minimum value separation circuit 102 is 1 and the second group number from the amplitude normalization circuit 103 is 3, (B) is selected from Table 4, and the reset signal is sent out after sending out the first output vector and the first index value corresponding to the first output vector 256 times. However, in view of the fact that the reset signal control value outputted by the amplitude normalization circuit 103 is 2, the number of output times is changed to 85 times from Table 5.

The first distortion operation circuit 105, using the vector with a minimum value and unit standard deviation X and the first output vector from the first codebook ROM 104: $Y = (Y_1, Y_2, \ldots Y_{12})$, obtains the distortion $d_1$ by the following equation:

$$d_1 = \sum_{i=1}^{12} |Y_i - X_i|$$

In case the distortion $d_1$ is a distortion $d_1$ which is smaller than that before, the first distortion operation circuit 105 reads in the newly obtained distortion $d_1$ and the first index value. The first codebook ROM 104, after outputting the first output vector 85 times, outputs a reset signal, and, when the first distortion operation circuit 105 takes in the reset signal, it sends out the read in first index value to the first encoding circuit 112.

Table 6 is a table relating to the Huffman coding allocation group of the first index value which is the first encoding circuit 112 can judge from the reset signal control value outputted by the amplitude normalization circuit 103.

TABLE 6

Assuming the reset signal control value to be R,

| | |
|---|---|
| (A) in case of R = 1, | the first group |

TABLE 6-continued

| Assuming the reset signal control value to be R. | |
| --- | --- |
| (B) in case of R = 2, | the second group |
| (C) in case of R = 3, | the third group |
| (D) in case of R = 4, | the fourth group |

The first encoding circuit 112 performs encoding of the first index value from the first codebook ROM 104 in the following manner. From the fact that the reset signal control value from the amplitude normalization circuit 103 is 2, the second group is selected according to Table 6. Each group has a Huffman code suited to its own group, which allocates the first index value to the Huffman code judged from the second group to effect Huffman coding and sends it out to the first output signal terminal 115.

It is specified herein that the 12 dimension vectors are inputted; in the mean value separation circuit 106 the 8 dimension vectors are handled; in the amplitude mean value separation circuit 109 the 6 dimension vectors are handled; both the second codebook ROM 107 and the third codebook ROM 110 hold 512 output vectors; the first group number is set as in Table 1; the second group number is set as in Table 2; the reset signal control value is set as in Table 3; the number of output times of the first output vector is limited as in Table 5; the allocation of Huffman code is set as in Table 6; an absolute value of the difference is used for distortion operation; and Huffman coding is used for coding. It is to be understood, however, that the invention is not limited to the above embodiment.

What is claimed is:

1. A vector quantization image processing apparatus for processing a block of k samples of an input image signal, where k is an integer, regarding the block of k samples as an input vector composed k elements, comprising:

a minimum value separation circuit for detecting an element having a minimum value among the k elements of said input vector, and for subtracting said minimum value from a value of each of the k elements of said input vector to obtain a minimum value separation vector, and for producing a first group number determined by a position of the element having said minimum value;

a first codebook ROM having stored therein a plurality of groups of first output vectors based on a statistical property of said minimum value separation vector and first index values corresponding respectively to the first output vectors, and for selecting one of said plurality of groups which is determined by said first group number produced by said minimum value separation circuit, and for reading out first output vectors of the selected group and first index values corresponding thereto, the number of the read out first output vectors being a specific number determined by said first group number, and for thereafter outputting a reset signal; and a first distortion operation circuit for calculating distortions from said minimum value separation vector produced by said minimum value separation circuit and said first output vectors read out from said first codebook ROM, and being responsive to said reset signal for outputting a first index value corresponding to a first output vector which provides by the distortion calculation a minimum distortion from among the calculated distortions.

2. An apparatus according to claim 1, further comprising a first encoding circuit for encoding said first index value outputted from said first distortion operation circuit into a variable length code.

3. An apparatus according to claim 2, wherein said first encoding circuit comprises a Huffman encoder.

4. An apparatus according to claim 1, wherein said first distortion operation circuit calculates absolute values of differences between values of elements of said minimum value separation vector produced by said minimum value separation circuit and values of elements of each of said first output vectors read out from said first codebook ROM, and summing the calculated absolute values to obtain each of said distortions.

5. An apparatus according to claim 1, further comprising an amplitude normalization circuit for detecting an element having a maximum value among elements of said minimum value separation vector produced by said minimum value separation circuit, and dividing a value of each of the elements of said minimum value separation vector by said maximum value to obtain a normalized minimum value separation vector, wherein said plurality of groups of first output vectors stored in said first codebook ROM are based on a statistical property of said normalized minimum value separation vector.

6. An apparatus according to claim 5, further comprising:

an amplitude mean value separation circuit for calculating a mean value of a block of n maximum values each being said maximum value obtained by said amplitude normalization circuit, where n is an integer, and for subtracting said mean value from each of said block of n maximum values to obtain an amplitude mean value separation vector;

a third codebook ROM having stored therein a plurality of third output vectors based on a statistical property of said amplitude mean value separation vector and third index values corresponding respectively to the third output vectors, and for reading out the third output vectors and the third index values corresponding thereto, the number of the read out third output vectors being a specific number;

a third distortion operation circuit for calculating distortions from said amplitude mean value separation vector obtained by said amplitude mean value separation circuit and said third output vectors read out from said third codebook ROM, and for outputting a third index value corresponding to a third output vector which gives by the distortion calculation a minimum distortion among the calculated distortions; and a third encoding circuit for encoding each of said mean value calculated by said amplitude mean value separation circuit and said third index value outputted from said third distortion operation circuit to a variable length code.

7. An apparatus according to claim 6, wherein said third distortion operation circuit calculates absolute values of differences between values of elements of said amplitude mean value separation vector obtained by said amplitude mean value separation circuit and values of elements of each of said third output vectors read out from said third codebook ROM, and summing the calculated absolute values to obtain each of said distortions.

8. An apparatus according to claim 6, wherein said third encoding circuit comprises a Huffman encoder.

9. An apparatus according to claim 5, wherein said amplitude normalization circuit further produces a second group number determined by a position of the element having said maximum value, and wherein said first codebook ROM selects one of said plurality of groups of first output vectors which is determined by said first and second group numbers.

10. An apparatus according to claim 5, wherein said amplitude normalization circuit further produces a reset signal control value determined by said maximum value, and wherein said first codebook ROM determines the number of first output vectors to be read out therefrom before outputting said reset signal according to said reset signal control value.

11. An apparatus according to claim 10, wherein said first encoding circuit encodes said first index value outputted from said first distortion operation circuit into a variable length code determined by said reset signal control value.

12. An apparatus according to claim 1, further comprising:
- a mean value separation circuit for calculating a mean value of a block of m minimum values each being said minimum value obtained by said minimum value separation circuit, where m is an integer, and subtracting said mean value from each of said block of m minimum values to obtain a mean value separation vector;
- a second codebook ROM having stored therein a plurality of second output vectors based on a statistical property of said mean value separation vector and second index values corresponding respectively to the second output vectors, and for reading out the second output vectors and the second index values corresponding thereto, the number of the read out second output vectors being a specific number;
- a second distortion operation circuit for calculating distortions from said mean value separation vector obtained by said mean value separation circuit and said second output vectors read out from said second codebook ROM, and outputting a second index value corresponding to a second output vector which gives by the distortion calculation a minimum distortion among the calculated distortions; and
- a second encoding circuit for encoding each of said mean value calculated by said mean value separation circuit and said second index value outputted from said second distortion operation circuit to a variable length code.

13. An apparatus according to claim 12, wherein said second distortion operation circuit calculates absolute values of differences between values of elements of said mean value separation vector obtained by said mean value separation circuit and values of elements of each of said second output vectors read out from said second codebook ROM, and summing the calculated absolute values to obtain each of said distortions.

14. An apparatus according to claim 12, wherein said second encoding circuit comprises a Huffman encoder.

* * * * *